United States Patent
Sasaki et al.

(10) Patent No.: US 7,084,459 B2
(45) Date of Patent: Aug. 1, 2006

(54) SOI SUBSTRATE

(75) Inventors: Tsutomu Sasaki, Futtsu (JP); Isao Hamaguchi, Futtsu (JP); Atsuki Matsumura, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/343,273

(22) PCT Filed: May 15, 2002

(86) PCT No.: PCT/JP02/04713

§ 371 (c)(1),
(2), (4) Date: Jan. 29, 2003

(87) PCT Pub. No.: WO02/097892

PCT Pub. Date: Dec. 5, 2002

(65) Prior Publication Data

US 2004/0018363 A1    Jan. 29, 2004

(30) Foreign Application Priority Data

May 29, 2001  (JP) .............. 2001-160430

(51) Int. Cl.
*H01L 27/01* (2006.01)
*H01L 27/12* (2006.01)
*H01L 31/0392* (2006.01)

(52) U.S. Cl. ............ 257/347; 438/149; 438/479; 438/517

(58) Field of Classification Search ............ None
See application file for complete search history.

(56) References Cited

U.S. PATENT DOCUMENTS

| 6,420,759 B1 * | 7/2002 | Yamazaki et al. .......... 257/354 |
| 6,524,977 B1 * | 2/2003 | Yamazaki et al. .......... 438/799 |
| 6,583,474 B1 * | 6/2003 | Yamazaki et al. .......... 257/354 |
| 6,599,360 B1 * | 7/2003 | Iida et al. .................. 117/19 |
| 6,641,888 B1 * | 11/2003 | Asayama et al. .......... 428/64.1 |

FOREIGN PATENT DOCUMENTS

| EP | 1 052 687 A1 | 11/2000 |
| JP | 2-237033 | 9/1990 |
| JP | 5-55230 | 3/1993 |
| JP | 7-193072 | 7/1993 |
| JP | 5-235007 | 9/1993 |
| JP | 5-259418 | 10/1993 |

(Continued)

OTHER PUBLICATIONS

Isao Hamaguchi, et al., "Elimination of square pits on SIMOX wafer by using Nitrogen-doped Cz crystal", 2000 IEEE International SOI Conference. Proceedings, 2000. 10, pp. 18 to 19.

*Primary Examiner*—Nathan J. Flynn
*Assistant Examiner*—Victor A. Mandala
(74) *Attorney, Agent, or Firm*—Kenyon & Kenyon LLP

(57) ABSTRACT

There is provided an SOI substrate having an SOI structure with an insulating layer and a surface single crystal silicon layer successively formed on a single crystal wafer, the SOI substrate having no pit generation in the SOI layer, being producible at low cost and at high productivity and having excellent gettering capacity, wherein the SOI substrate contains nitrogen and carbon with a nitrogen content of no greater than $1\times10^{16}$ atoms/cm$^3$ and a carbon content of no greater than $1\times10^{18}$ atoms/cm$^3$.

8 Claims, 2 Drawing Sheets

FOREIGN PATENT DOCUMENTS

| | | |
|---|---|---|
| JP | 9-293845 | 11/1997 |
| JP | 10-64837 | 3/1998 |
| JP | 2000-344598 | 12/2000 |
| JP | 2001-144275 | 5/2001 |

* cited by examiner

SOI SUBSTRATE

TECHNICAL FIELD

The present invention relates to an SOI substrate comprising an oxide layer buried near the surface of a silicon substrate and a single crystal silicon layer (hereinafter referred to as SOI (Silicon-On-Insulator) layer) formed thereover. The invention further relates to an SOI substrate fabricated by SIMOX (Separation by IMplanted OXygen) technology.

BACKGROUND ART

SIMOX substrates and bonded SOI wafers are known as primary types of SOI substrates having single crystal silicon layers formed on an insulator such as silicon oxide. SIMOX substrates are SOI substrates obtained by implanting oxygen ions into a single crystal silicon substrate by implantation of oxygen ions, and subsequently performing annealing treatment for chemical reaction between the oxygen ions and silicon atoms to form a buried oxide layer.

Bonded SOI wafers, on the other hand, are SOI substrates obtained by bonding two single crystal silicon wafers one of which is oxidized on the surface thereof but the other is not, and thinning one of the two wafers.

Such SIMOX substrates and bonded SOI wafers employ silicon single crystals grown by the Czochralski (CZ) process or the magnetic-field-applied CZ process. Such silicon single crystals normally contain void defects, which constitute a problem for fabrication of devices using SOI substrates. In the case of SIMOX substrates, void defects are exposed on the surface single crystal silicon layer (SOI layer) after high-temperature heat treatment, being observed as square surface pits. These surface pits are undesirable for device fabrication because they lead to film thickness variation of the SOI layer. Also, some of the surface pits will impair the reliability of a gate oxide film of a MOSFET fabricated using the SIMOX substrates, and therefore an absence of surface pits is desired. In bonded SOI wafers as well, if the thickness of the SOI layer is comparable to the size of the void defects, the void defects in the SOI layer will form pits passing through the SOI layer and, for example, when immersed in a 25 wt % HF solution, the buried oxide layer elutes out to exhibit circular depressions. These are therefore referred to as HF defects, and because such SOI-penetrating pits destroy the very structure of the device, their complete absence is preferred in SOI layers.

The following two methods have been devised in order to avoid generation of such pits. The first is a method using an "epiwafer" with single crystal silicon epitaxially grown on a single crystal silicon wafer. This method is used because void defects that can lead to pits are not present in the epilayer of epiwafers. The other method is a method using a nitrogen-added single crystal silicon wafer during the crystal growth in the CZ process, as proposed in Japanese Unexamined Patent Publication HEI No. 10-64837. By controlling the nitrogen concentration it is possible to reduce or eliminate pits. However, the epiwafer is not a preferred choice, because of the high cost of epiwafers. In nitrogen-added single crystal silicon substrates, a higher nitrogen concentration gives a higher effect of preventing pit generation but tends to result in polycrystallization during crystal growth with increasing nitrogen addition, such that a trade-off exists with respect to productivity and cost.

It is an object of the present invention to solve the problems described above by providing an SOI substrate with no pit generation in the SOI layer, which is producible at low cost and at high productivity, and which has excellent gettering capacity.

DISCLOSURE OF THE INVENTION

The present inventors have conducted diligent research on pits generated in SOI layers of SOI substrates and have thereupon completed the present invention which provides an SOI substrate with no pit generation in the SOI layer, which is producible at low cost and at high productivity, and which has excellent gettering capacity.

Specifically, the present invention provides the following.

An SOI substrate having an SOI structure with an insulating layer and a surface single crystal silicon layer successively formed on a single crystal silicon substrate, characterized in that the SOI substrate contains nitrogen and carbon, with a nitrogen content of no greater than $1 \times 10^{16}$ atoms/cm$^3$ and a carbon content of no greater than $1 \times 10^{18}$ atoms/cm$^3$.

The aforementioned SOI substrate wherein the nitrogen and carbon have a concentration distribution in the SOI substrate such that the maximum nitrogen concentration is at least $1 \times 10^{12}$ atoms/cm$^3$ and the maximum carbon concentration is at least $5 \times 10^{15}$ atoms/cm$^3$.

An SOI substrate fabricated by a SIMOX process wherein oxygen ions are implanted into a silicon single crystal wafer which is then subjected to high-temperature heat treatment to form a buried oxide layer, as an insulating layer, and a surface single crystal silicon layer, characterized in that the SOI substrate contains nitrogen and carbon, with a nitrogen content of no greater than $1 \times 10^{16}$ atoms/cm$^3$ and a carbon content of no greater than $1 \times 10^{18}$ atoms/cm$^3$.

The aforementioned SOI substrate wherein the maximum nitrogen concentration is at least $1 \times 10^{12}$ atoms/cm$^3$ and the maximum carbon concentration is at least $5 \times 10^{15}$ atoms/cm$^3$.

The aforementioned SOI substrate which has a signal intensity variation that exhibits nitrogen segregation near the interface between the surface silicon layer and the insulating layer, when the SOI substrate is subjected to nitrogen analysis by secondary ion mass spectrometry in the direction of thickness.

The aforementioned SOI substrate which has a signal intensity variation that exhibits nitrogen segregation near the interface between the insulating layer and the single crystal wafer, when the SOI substrate is subjected to nitrogen analysis by secondary ion mass spectrometry in the direction of thickness.

The aforementioned SOI substrate characterized in that before, during or after its fabrication it is subjected to heat treatment from 700° C. to 1000° C. for a period from 5 minutes to 20 hours and heat treatment from 900° C. to 1100° C. for a period from 5 minutes to 20 hours.

The aforementioned SOI substrate fabricated by a SIMOX process wherein oxygen ions are implanted into a silicon single crystal wafer which is then subjected to high-temperature heat treatment to form a buried oxide layer, as the insulating layer, and a surface single crystal silicon layer, characterized in that either before or after the high-temperature heat treatment, it is subjected at least once to heat treatment from 700° C. to 1000° C. for a period from 5 minutes to 20 hours and heat treatment from 900° C. to 1100° C. for a period from 5 minutes to 20 hours.

PREFERRED EMBODIMENT OF THE INVENTION

The present invention will now be explained in further detail.

Figure 1A:
FIGS. 1A to 1D show a process for fabrication of a SIMOX substrate from a silicon wafer.
Figure 1B:
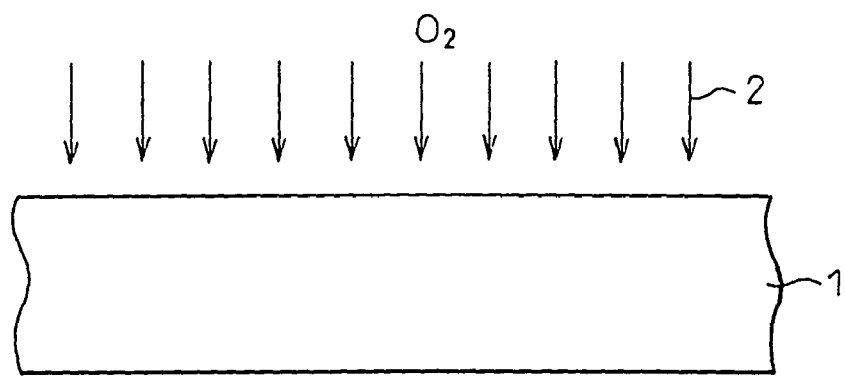
Figure 1C:
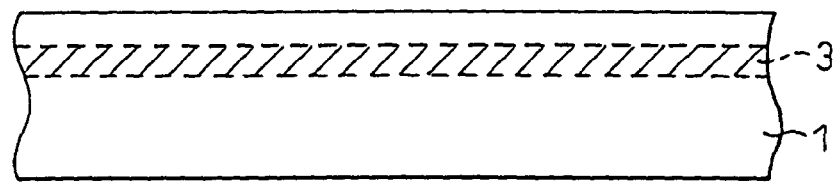
Figure 1D:
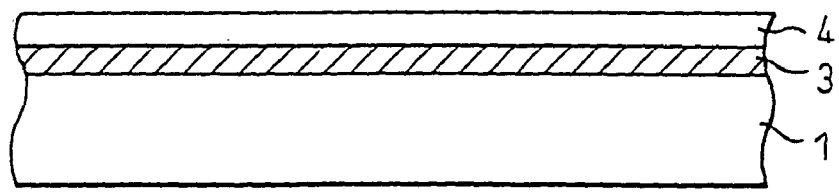

The fabrication steps for an SOI substrate by SIMOX will now be explained in brief with reference to FIGS. 1A to 1D. A single crystal silicon substrate 1 fabricated by the Czochralski process, shown in FIG. 1A, is implanted with oxygen ions 2 from above the silicon substrate 1 in a high electric field as shown in FIG. 1B, and a buried oxide layer 3 is formed inside the silicon substrate 1 as shown in FIG. 1C. The silicon substrate 1 is then heat treated to form an SOI substrate comprising the silicon substrate 1, the buried oxygen layer 3 and a silicon layer 4 above it (FIG. 1D).

Figure 1E:
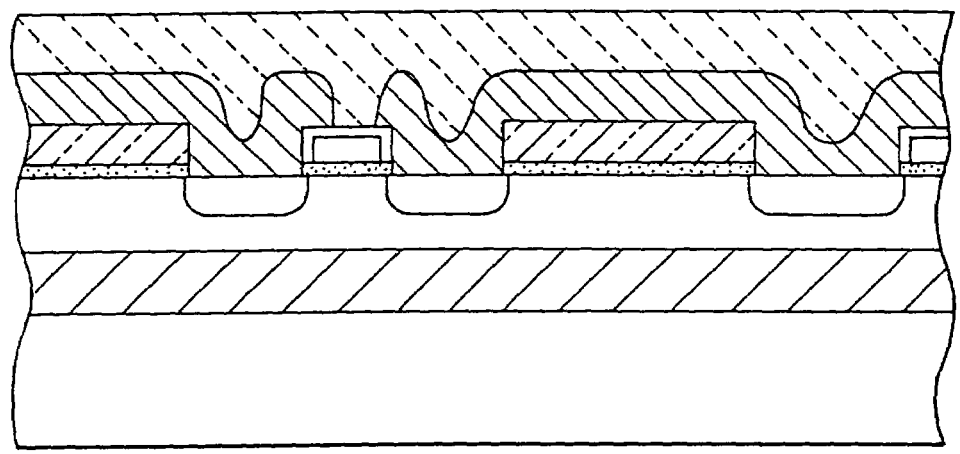
FIG. 1E shows an example of additionally forming a semiconductor element on a SIMOX substrate.

The SOI substrate may then be subjected to semiconductor fabrication steps utilizing the silicon layer 4 on the oxygen layer 3 and forming a wiring layer 5 thereover, to manufacture a transistor or other semiconductor element or semiconductor circuit (FIG. 1E).

Figure 2:
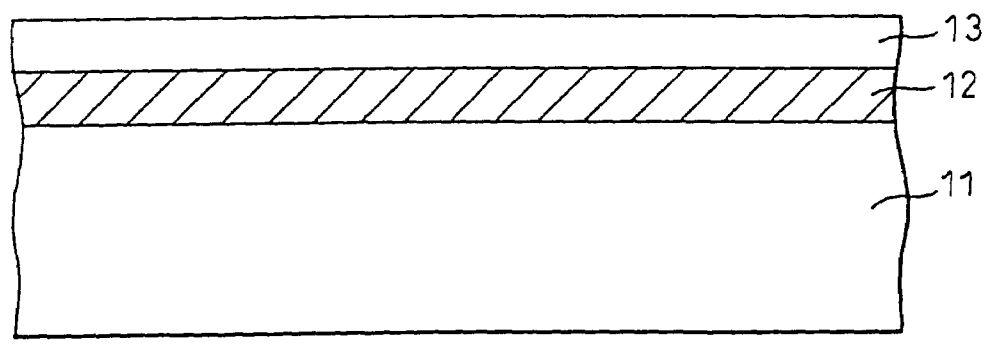
FIG. 2 shows a bonded SOI wafer.

FIG. 2 shows an example of a bonded SOI wafer. A single silicon substrate 11, an insulating layer 12 and a surface single crystal silicon layer 13 are bonded. The bonding may be accomplished by thermal diffusion or the like. After the bonding, the surface single crystal silicon layer 13 may be adjusted to the desired thickness by polishing or the like.

According to the invention, the SOI substrate having an insulating layer and a surface single crystal silicon layer successively formed on a single crystal wafer contains nitrogen and carbon at prescribed concentrations in the SOI substrate.

The single crystal silicon wafer may be any one which gives the prescribed nitrogen and carbon concentrations, and it may be either of a P-type or N-type conductivity. The method for fabricating the single crystal silicon may be either the Czochralski process or the floating zone process, but the Czochralski process is preferred from the standpoint of easier addition of nitrogen and carbon and the mechanical strength of the wafer.

In a bonded SOI wafer, it is sufficient if the wafer which is to serve as the SOI layer has the nitrogen and carbon concentrations specified according to the invention. The other wafer may be composed of a material such as single crystal silicon, polysilicon, quartz, rock crystal, sapphire, or the like.

If the nitrogen content in the SOI substrate is greater than $1 \times 10^{16}$ atoms/cm$^3$, the nitrogen will approach the solubility limit of the silicon, thereby resulting in polycrystallization and rendering the substrate unsuitable for practical use. If the carbon content is greater than $1 \times 10^{18}$ atoms/cm$^3$, the carbon will approach the solubility limit of the silicon, thereby resulting in polycrystallization and also rendering the wafer unsuitable for practical use.

On the other hand, if the maximum nitrogen concentration in the SOI substrate is less than $1 \times 10^{12}$ atoms/cm$^3$ or the maximum carbon concentration in the SOI wafer is less than $5 \times 10^{15}$ atoms/cm$^3$, no pit-eliminating effect is exhibited.

Because the SOI substrate of the invention is heat treated, whether fabricated by a SIMOX process or bonded SOI process, the nitrogen contained therein diffuses outwardly. The nitrogen is segregated at the interface between the insulating layer and the silicon, and therefore the SOI substrate has a signal intensity variation that exhibits nitrogen segregation near the interface between the insulating layer and the single crystal wafer or near the interface between the surface silicon layer and the insulating layer, when subjected to nitrogen analysis by secondary ion mass spectrometry in the direction of thickness.

In the case of an SOI wafer fabricated by a SIMOX process, it may be fabricated by a process of, for example, implanting oxygen ions at an acceleration energy of 180 kev and a dose of $4 \times 10^{17}$ atoms/cm$^2$ to form a high-density oxygen ion implanted layer at the predetermined depth, annealing at a temperature of 1350° C. for 4 hours in an Ar gas atmosphere containing oxygen at a 0.5% concentration, followed by annealing for 4 hours with an oxygen concentration of 70%. However, the SIMOX substrate fabrication conditions are not particularly restricted to these conditions.

Contamination by metal impurity elements can cause operation flaws in integrated circuit elements (devices), and therefore the fabrication process and environment must be clean. However, because of the difficulty of completely eliminating such contamination, substrates for integrated circuit have conventionally required a gettering capacity, i.e., a function of capturing and neutralizing contaminating metal impurity elements outside the device active regions.

Several means exist for accomplishing this, such as lowering the temperature of the device fabrication process and utilizing oxygen precipitates and defects created along with their formation, i.e., BMDs (Bulk Micro Defects). While the BMD density required for gettering is not necessarily the same for all purposes, the lower limit for expression of function is considered to be about $1 \times 10^8$ defects/cm$^3$, as indicated in Japanese Unexamined Patent Publication No. 2000-44389 or Japanese Unexamined Patent Publication No. 2001-102384, for example. BMD formation is usually accomplished by heat treatment from 700° C. to 1000° C. for a period from 5 minutes to 20 hours and heat treatment from 900° C. to 1100° C. for a period from 5 minutes to 20 hours. One example is heat treatment for 4 hours at 800° C. followed by heat treatment for 8 hours at 1000° C. in a non-oxidizing atmosphere.

In a bonded SOI process, sufficient BMD may be formed by performing the aforementioned heat treatment on the other wafer which is not the wafer to form the SOI layer. The heat treatment may be carried out either before or after fabrication of the SOI substrate by the bonding. If the bonding heat treatment is from 900° C. to 1100° C. for a period from 5 minutes to 20 hours, then this may be omitted in favor of only heat treatment from 700° C. to 1000° C. for a period from 5 minutes to 20 hours.

In a SIMOX process, as a high-temperature heat treatment is employed, some of the formed BMDs disappear in the heat treatment before the fabrication of the SOI, but it is possible to overcome the effect of incidental contamination during the high-temperature heat treatment. If nitrogen and carbon are present in the amounts mentioned above, by performing the heat treatment described above, even after the high-temperature heat treatment of the SIMOX process, a sufficient BMD density is obtained and therefore adequate gettering capacity is provided.

EXAMPLE

The present invention will now be explained in further detail through the following example.

A boron-doped single crystal silicon was grown by the Czochralski process. The procedure described in the Example in Japanese Unexamined Patent Publication No. 2000-281491 was followed to obtain crystals containing nitrogen at $1\times10^{15}$ atoms/cm$^3$ and carbon at $1\times10^{17}$ atoms/cm$^3$, and to obtain an 8-inch (200 mm) single crystal substrate.

Next, a SIMOX substrate was fabricated according to a common SIMOX substrate fabrication method of the prior art. Specifically, oxygen ions were implanted at an acceleration energy of 180 keV and a dose of $4\times10^{17}$ atoms/cm$^2$ to form a high-density oxygen ion implanted layer of the predetermined depth. The annealing temperature was set to 1350° C. and annealed for 4 hours in an Ar gas atmosphere containing oxygen at a 0.5% concentration, followed by further annealing for 4 hours with the oxygen concentration adjusted to 70%. As a result there was obtained a SIMOX substrate with a surface silicon layer thickness of approximately 160 nm and a buried oxide film thickness of approximately 110 nm.

As a result of examining the nitrogen concentration and carbon concentration in the substrate by low-temperature infrared absorption, the nitrogen concentration was found to be approximately $5\times10^{13}$ atoms/cm$^3$ and the carbon concentration approximately $1\times10^{17}$ atoms/cm$^3$. The nitrogen in the surface silicon layer was evaluated by secondary ion mass spectrometry and surface electric resistance measurement to be less than $1\times10^{12}$ atoms/cm$^3$. When the nitrogen was analyzed by secondary ion mass spectrometry in the direction of the SOI substrate thickness, nitrogen signal intensity peaks indicating nitrogen segregation were observed at the interface between the surface silicon layer and the insulating layer and at the interface between the insulating layer and the single crystal silicon.

After the annealing, the surface oxide film was removed and the surface was observed with an optical microscope, but no generation of surface pits was found.

Upon heat treatment at 800° C. for 1 hour followed by heat treatment at 1000° C. for 4 hours in Ar, an infrared tomograph indicated formation of $1\times10^9$ defects/cm$^3$ at a depth of 10 μm or more from the surface of the substrate, suggesting adequate gettering capacity.

Separately, an ordinary wafer containing no added nitrogen or carbon was used to fabricate a SIMOX substrate by the same SIMOX process. Upon observation of the surface by the optical microscope, after removing the surface oxide film, pits were observed at a density of approximately 10/cm$^2$. The shapes of the pits were either conical or tetragonal pyramidal with a diameter of approximately 10 μm. When the wafer was immersed in hydrofluoric acid and the eluting state of the buried oxide layer from the pit portions was observed, it was found that the SOI structure near the pits had disappeared.

Upon subsequent heat treatment at 800° C. for 1 hour and at 1000° C. for 4 hours in Ar, an infrared tomograph indicated no BMD inside the wafer, i.e. it was below the detection limit, thus demonstrating inadequate gettering capacity.

INDUSTRIAL APPLICABILITY

As explained above, the present invention provides an SOI substrate with no pit generation in the SOI layer, which is producible at low cost and at high productivity, and which has excellent gettering capacity. Utilizing the SOI substrate to fabricate devices can provide devices with satisfactory operating characteristics at a high yield.

The invention claimed is:

1. An SOI substrate having an SOI structure with an insulating layer and a surface single crystal silicon layer successively formed on a single crystal wafer, characterized in that said SOI substrate contains nitrogen and carbon, with a nitrogen content of no greater that $1\times10^{16}$ atoms/cm$^3$ and a carbon content of no greater than $1\times10^{18}$ atoms/cm$^3$, and wherein said SOI substrate contains no pits in the single crystal silicon layer.

2. The SOI substrate according to claim 1, wherein said nitrogen and carbon have a concentration distribution in said SOI wafer such that the maximum nitrogen concentration is at least $1\times10^{12}$ atoms/cm$^3$ and the maximum carbon concentration is at least $5\times10^{15}$ atoms/cm$^3$.

3. The SOI substrate according to claim 1 or 2 which has a signal intensity variation that exhibits nitrogen segregation near the interface between said surface silicon layer and said insulating layer, when said SOI substrate is subjected to nitrogen analysis by secondary ion mass spectrometry in the direction of thickness of the SOI substrate.

4. The SOI substrate according to claim 1 or 2 which has a signal intensity variation that exhibits nitrogen segregation near the interface between said insulating layer and said single crystal wafer, when said SOI substrate is subjected to nitrogen analysis by secondary ion mass spectrometry in the direction of thickness of the SOI substrate.

5. A method for fabricating an SOI substrate, comprising the steps of:
   implanting oxygen ions into a silicon single crystal wafer;
   subjecting the implanted silicon single crystal wafer to a high-temperature heat treatment to form a buried oxide layer, as an insulating layer, and a surface single crystal silicon layer;
   wherein said SOI substrate contains no pits in the single crystal silicon layer and said method further comprises the steps of:
   adding nitrogen and carbon to the silicon wafer; and
   controlling the concentrations of the nitrogen and carbon such that the fabricated SOI substrate has a nitrogen concentration of no greater than $1\times10^{16}$ atoms/cm$^3$ and a carbon concentration of no greater than $1\times10^{18}$ atoms/cm$^3$.

6. The method according to claim 5 wherein the added amounts of the nitrogen and carbon in said adding step are controlled such that the maximum nitrogen concentration is at least $1\times10^{12}$ atoms/cm$^3$ and the maximum carbon concentration is at least $5\times10^{15}$ atoms/cm$^3$.

7. The method according to claim 5 or 6, wherein before, during or after fabricating said SOI substrate, said wafer is subjected to a heat treatment from 700° C. to 1000° C. for a period from 5 minutes to 20 hours and heat treatment from 900° C. to 1100° C. for a period from 5 minutes to 20 hours.

8. The method according to claim 5 or 6, wherein either before or after said high-temperature heat treatment, said wafer is subjected at least once to a heat treatment from 700° C. to 1000° C. for a period from 5 minutes to 20 hours and heat treatment from 900° C. to 1100° C. for a period from 5 minutes to 20 hours.

* * * * *